(12) United States Patent
Caillat et al.

(10) Patent No.: US 10,153,049 B2
(45) Date of Patent: Dec. 11, 2018

(54) ERASING MEMORY SEGMENTS IN A MEMORY BLOCK OF MEMORY CELLS USING SELECT GATE CONTROL LINE VOLTAGES

(71) Applicant: MICRON TECHNOLOGY, INC., Boise, ID (US)

(72) Inventors: Christian Caillat, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/722,188

(22) Filed: Oct. 2, 2017

(65) Prior Publication Data

US 2018/0068737 A1  Mar. 8, 2018

Related U.S. Application Data

(63) Continuation of application No. 14/943,541, filed on Nov. 17, 2015, now Pat. No. 9,779,829.

(51) Int. Cl.

| | |
|---|---|
| G11C 16/10 | (2006.01) |
| G11C 8/12 | (2006.01) |
| G11C 16/34 | (2006.01) |
| G11C 16/14 | (2006.01) |
| G11C 16/16 | (2006.01) |
| G11C 16/04 | (2006.01) |
| G11C 16/08 | (2006.01) |

(52) U.S. Cl.
CPC ...... *G11C 16/3445* (2013.01); *G11C 16/0483* (2013.01); *G11C 16/08* (2013.01); *G11C 16/14* (2013.01); *G11C 16/16* (2013.01)

(58) Field of Classification Search
None
See application file for complete search history.

(56) References Cited

U.S. PATENT DOCUMENTS

| 8,913,431 B1 | 12/2014 | Costa et al. |
| 9,036,428 B1 | 5/2015 | D'Abreu |
| 2006/0256629 A1 | 11/2006 | Roohparvar |

(Continued)

OTHER PUBLICATIONS

Pan, et al.; "Apparatuses and Methods for Segmented SGS Lines"; U.S. Appl. No. 14/518,807, filed Oct. 20, 2014; Total pp. 25.

*Primary Examiner* — Son Dinh
*Assistant Examiner* — Sultana Begum
(74) *Attorney, Agent, or Firm* — Dicke, Billig & Czaja, PLLC

(57) ABSTRACT

A method includes applying erase voltages to data lines and source lines of a memory block of memory cells in a non-volatile NAND architecture memory device during an erase operation. The memory block of memory cells includes a plurality of memory segments and a corresponding plurality of first select gate control lines. Each memory segment includes a plurality of memory sub-blocks that share a respective one of the first select gate control lines. The method includes applying a first bias voltage to the respective first select gate control line of a first one of the memory segments that has failed an erase verify operation to facilitate erasing the first memory segment during the erase operation, and applying a second bias voltage different from the first bias voltage to the respective first select gate control line of a second one of the memory segments that has passed the erase verify operation to facilitate inhibiting erasing of the second memory segment during the erase operation.

24 Claims, 6 Drawing Sheets

(56) References Cited

U.S. PATENT DOCUMENTS

| | | |
|---|---|---|
| 2013/0044549 A1 | 2/2013 | Goda et al. |
| 2013/0163336 A1 | 6/2013 | Li et al. |
| 2013/0336070 A1 | 12/2013 | Sakui et al. |
| 2014/0036590 A1 | 2/2014 | Feeley et al. |
| 2014/0063947 A1 | 3/2014 | Ghodsi |
| 2014/0122773 A1 | 5/2014 | Abraham et al. |
| 2014/0169098 A1 | 6/2014 | Tanzawa et al. |
| 2014/0226414 A1 | 8/2014 | Costa et al. |

ERASING MEMORY SEGMENTS IN A MEMORY BLOCK OF MEMORY CELLS USING SELECT GATE CONTROL LINE VOLTAGES

RELATED APPLICATIONS

This Application is a Continuation of U.S. application Ser. No. 14/943,541, titled "ERASING MEMORY SEGMENTS IN A MEMORY BLOCK OF MEMORY CELLS USING SELECT GATE CONTROL LINE VOLTAGES," filed Nov. 17, 2015, now U.S. Pat. No. 9,779,829 issued on Oct. 3, 2017, which is commonly assigned and incorporated herein by reference.

TECHNICAL FIELD

The present disclosure relates generally to memory and, in particular, in one or more embodiments, the present disclosure relates to a segmented erase and verify method for non-volatile memory devices.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power consumption is often an important consideration in the design and usage of memory devices. Speed of memory access can be another important consideration in the design and usage of memory devices. Mitigating an over-stress of memory cells during erase operations can be another important consideration in the design and usage of memory devices.

For the reasons stated above, and for other reasons stated below which will become apparent to those skilled in the art upon reading and understanding the present specification, there is a need in the art for alternative methods of operating memory, and apparatus to perform such methods.

DETAILED DESCRIPTION

Figure 1:
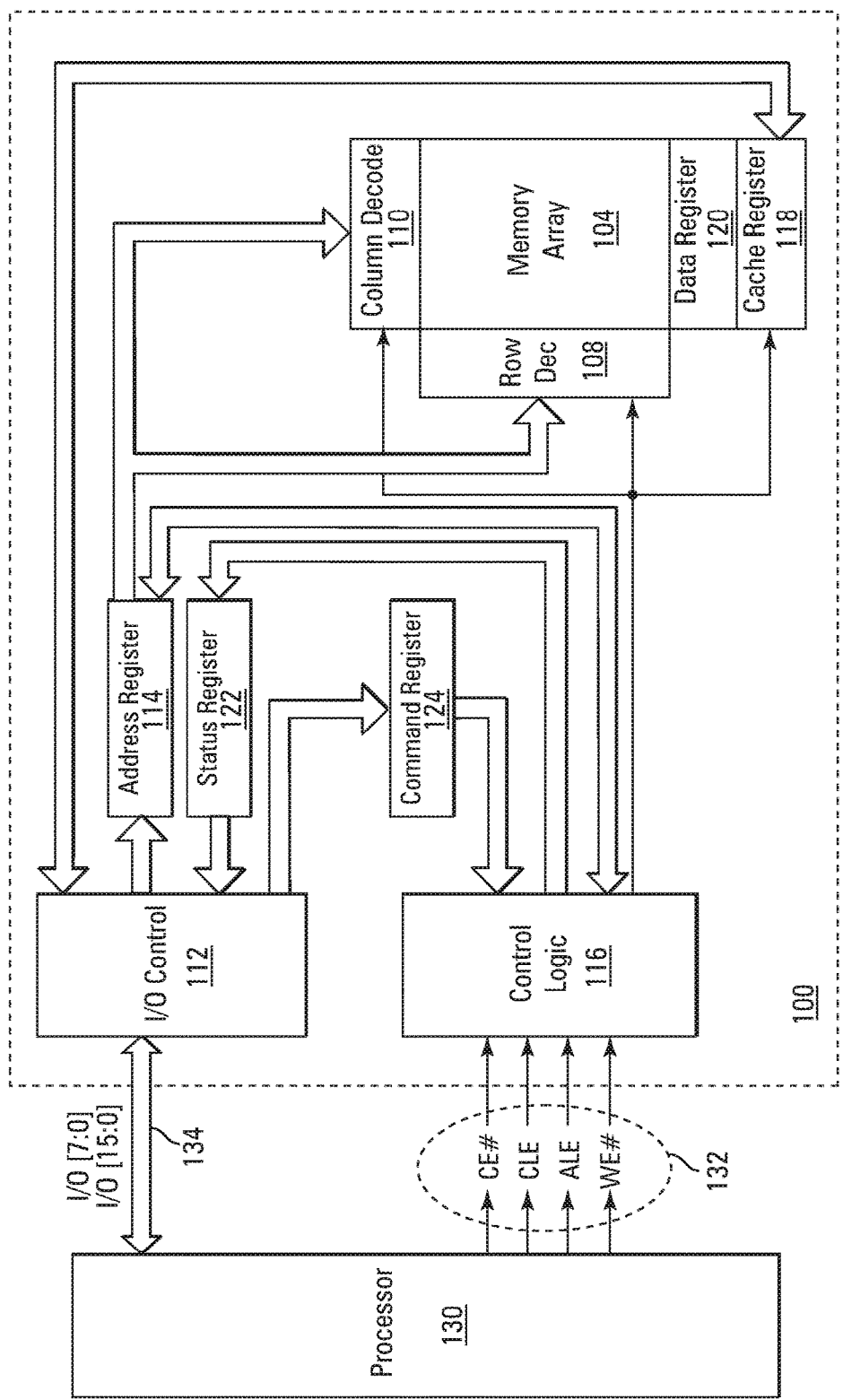
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Various embodiments described herein are directed to a segmented erase and verify method for memory devices as an alternative to a block erase method or as a supplement to the block erase method. Various embodiments take advantage of the segmentation of the select gate source (SGS) electrodes within a memory block in some memory devices (e.g., a NAND memory device in which various subsets of memory sub-blocks in a memory block share a common SGS electrode instead of all memory sub-blocks of the memory block sharing a common SGS electrode). In the block erase method, a memory block may be identified for an extra erase pulse at a higher voltage when a memory sub-block is failing erase verify. As a consequence, some memory sub-blocks may undergo an unnecessary voltage stress, e.g., where they have passed the erase verify. In the segmented SGS erase and verify method according to an embodiment, the erase verify may be performed per SGS memory segment. A memory segment may be identified as a "fail" at the first memory sub-block failing erase verify, and an extra erase pulse may be applied to failing memory segments while passing memory segments are inhibited through SGS/SGD biasing, thus limiting the amount of memory sub-blocks experiencing an overstress during erase.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 arranged in rows and columns. Memory cells of a row are typically connected to the same memory access line (commonly referred to as a word line) while memory cells of a column are typically selectively connected to the same data line (commonly referred to as a bit line). A single memory access line may be associated with more than one row of memory cells and a single data line may be associated with more than one column. Memory cells (not shown in FIG. 1) of at least a portion of array of memory cells 104 are capable of being programmed to one of at least two data states.

A row decode circuitry 108 and a column decode circuitry 110 are provided to decode address signals. For 3D NAND, extra decode circuitry is provided to differentiate memory sub-blocks. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
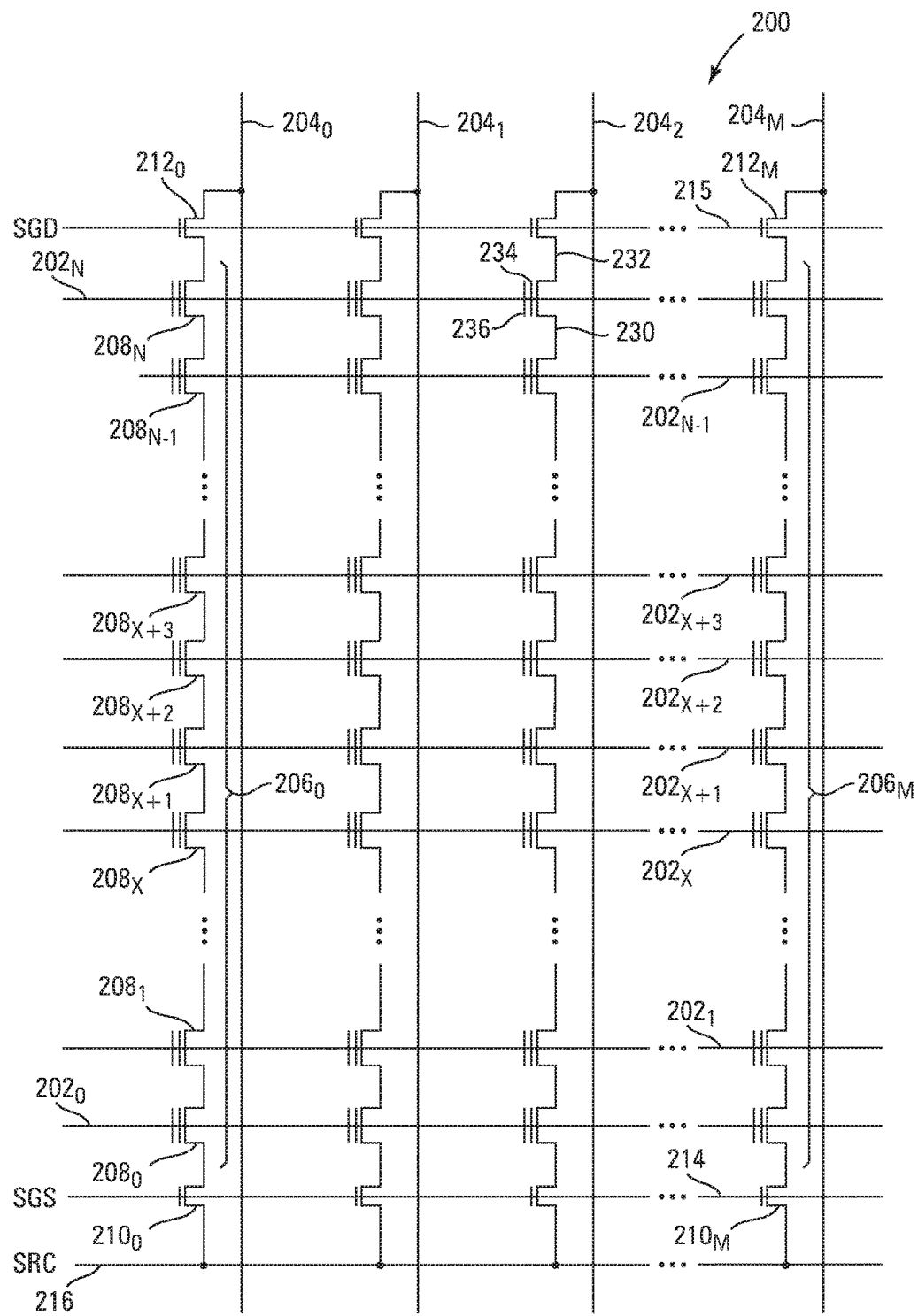
FIG. 2 is a schematic of a portion of an array of memory cells as could be used in a memory device of the type described with reference to FIG. 1.

FIG. 2 is a schematic of a NAND memory array 200, e.g., as a portion of array of memory cells 104. Memory array 200 includes memory access lines, such as word lines $202_0$ to $202_N$, and data lines, such as bit lines $204_0$ to $204_M$. The word lines 202 may be connected to global memory access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source (SGS) transistors), and a select transistor 212 (e.g., a field-effect transistor), such as one of the select transistors $212_0$ to $212_M$ (e.g., that may be drain select transistors, commonly referred to as select gate drain (SGD) transistors). Select transistors $210_0$ to $210_M$ might be commonly connected to a select line 214, such as a source select line (e.g., an SGS line), and select transistors $212_0$ to $212_M$ might be commonly connected to a select line 215, such as a drain select line (e.g., an SGD line).

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively connect a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. Memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 connected to a given bit line 204. A row of the memory cells 208 are memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
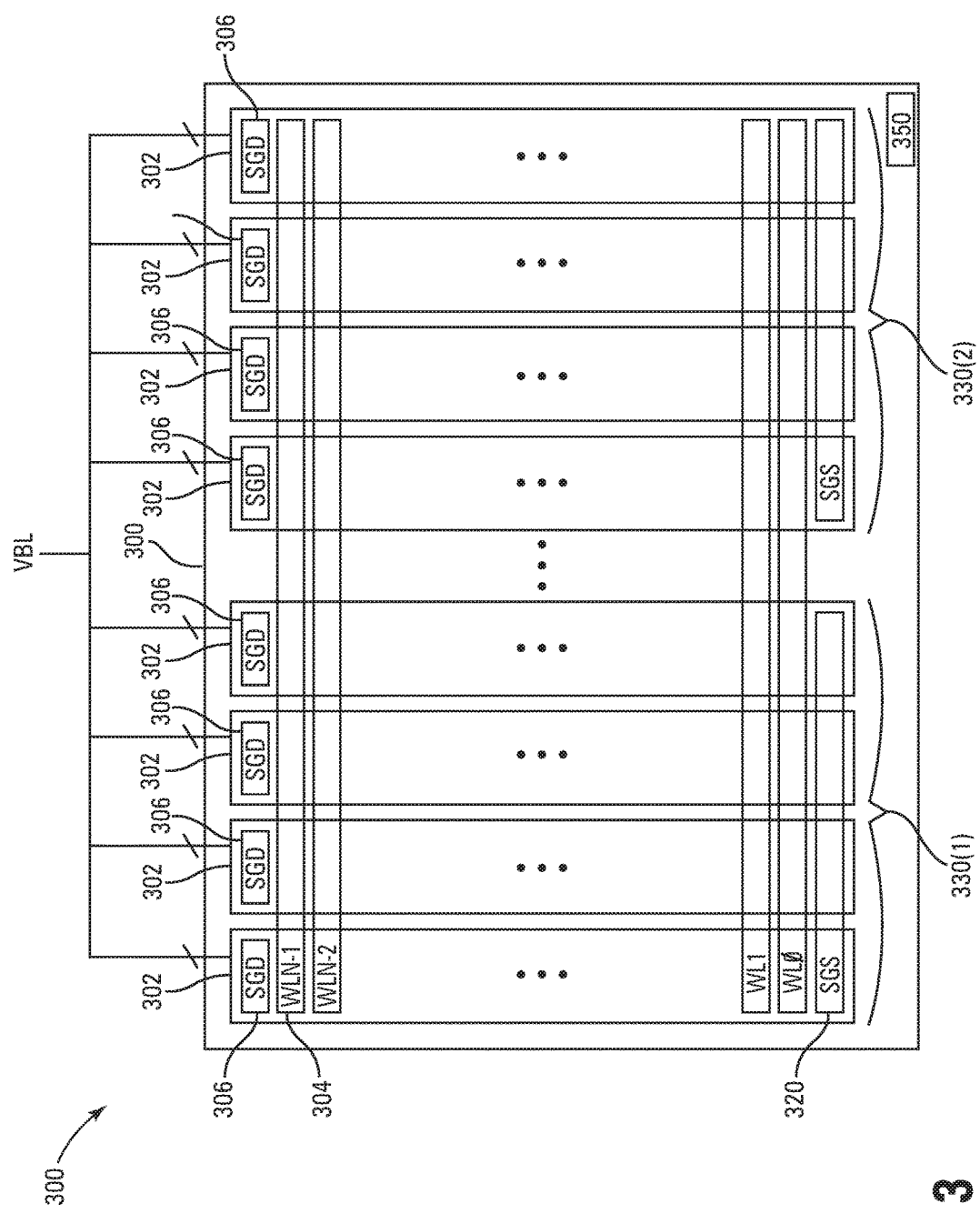
FIG. 3 is a block diagram of an apparatus that includes a memory block with memory sub-blocks organized into memory segments according to an embodiment.

FIG. 3 is a block diagram of an apparatus that includes a memory block 300 with memory sub-blocks organized into memory segments according to an embodiment. The memory block 300 includes a plurality of memory sub-blocks 302, a plurality of memory access lines 304, a plurality of select gate drain (SGD) control lines 306, a plurality of select gate source (SGS) control lines 320, and control unit 350. Each of the SGD control lines 306 may be associated with a respective memory sub-block 302 and each of the SGS control lines 320 may be associated with a respective plurality of memory sub-blocks 302, also referred to herein as a respective memory segment of memory sub-blocks 302.

In some examples, each of the memory sub-blocks 302 may include a plurality of memory cells, such as non-volatile memory cells (e.g., memory cells arranged in NAND strings) that may be arranged in rows and/or columns. Because each plurality of memory cells may include NAND memory cells, each plurality of memory cells may be implemented using one or more NAND strings within each memory sub-block 302. Each string may, for instance, include 32 serially-connected non-volatile memory cells, or may include a greater or lesser number of memory cells, and memory cells of each string may share a common channel. Each memory sub-block 302 may include any number of strings. Example NAND strings are shown in FIG. 2 and described above with reference to that figure.

In some examples, an SGD select transistor may be configured to selectively connect a string to a signal line VBL (e.g., data line) and an SGS select transistor may be configured to selectively connect a string to a source (e.g., source line) SRC (FIG. 2). By way of example, an SGD select transistor of a string included in a memory sub-block 302 may be connected to a respective SGD control line 306 associated with the memory sub-block 302. Providing (e.g., asserting) a control signal (e.g., active control signal) on the SGD control line 306 may enable the respective SGD select transistor, thereby coupling the associated string to the signal line VBL. An SGD control line 306 providing a control signal to enable the SGD select transistor in this manner is described herein as an "active" SGD control line 306. Similarly, an SGS select transistor of a memory sub-block 302 may be connected to an SGS control line 320 associated with the memory sub-block 302. Providing a control signal on the SGS control line 320 may enable the SGS select transistor, thereby coupling the respective string to the source SRC. An SGS control line 320 providing a control signal to enable the SGS select transistor in this manner is described herein as an "active" SGS control line 320.

Providing (e.g., deasserting) a control signal (e.g., inactive control signal) on the SGD control line 306 may disable the respective SGD select transistor, thereby decoupling the associated string from the signal line VBL. An SGD control line 306 providing a control signal to disable the SGD select transistor in this manner is described herein as an "inactive" SGD control line 306. Providing a control signal on the SGS line 320 may disable the SGS select transistor, thereby decoupling the respective string from the source SRC. An SGS control line 320 providing a control signal to disable the SGS select transistor in this manner is described herein as an "inactive" SGS control line 320.

In some examples, control signals provided on respective SGD control lines 306 and SGS control lines 320, respectively, may be provided by control unit 350. The control unit 350 may be connected to each of the SGD control lines 306 and the SGS control lines 320 and further may be configured to provide control signals to perform respective memory operations, described herein. The control unit 350 may be implemented in software and/or hardware, and may include any circuitry and/or logic to perform operations. In some examples, the control unit 350 may be included in the memory block 300 and in other examples, the control unit 350 may be located outside of the memory block 300, for instance, in a row decoder, an address decoder, control logic connected to the memory block 300 and/or a controller (not shown in FIG. 3). In this manner, one or more portions of the circuitry and/or logic of the control unit 350 may be employed in a distributed configuration.

Each SGD control line 306 may be associated with a respective memory sub-block 302 of the memory block 300. Each memory access line 304 may be associated with all memory sub-blocks 302 of the memory block 300. Each SGS control line 320 may be associated with a respective plurality of memory sub-blocks 302 of the memory block 300. Accordingly, each SGD control line 306 may be included, at least in part, in a respective memory sub-block 302 and may be connected to the SGD select transistor of the corresponding memory sub-block 302. In this manner, each active SGD control line 306 may connect the string or strings of a respective memory sub-block 302 to a set of signal lines shared, for instance, by each memory sub-block 302. A memory access line 304 may be connected to a memory cell of a string in each memory sub-block 302 of the memory block 300. As a result, a memory access line 304 may span across all memory sub-blocks 302 of the memory block 300 and may be connected to each memory cell of a particular row of memory cells. Each SGS control line 320 may span across an associated plurality of memory sub-blocks 302 and may be connected to the SGS select transistors of the associated memory sub-blocks 302. In this manner, an active SGS control line 320 may connect strings of the associated plurality of memory sub-blocks 302 to a source SRC. In some examples, SGD control lines 306 and/or SGS control lines 320 may span memory sub-blocks 302 in a same direction as memory access lines 304 such that the SGD control lines 306, memory access lines 304, and/or SGS control lines 320 are substantially parallel. In other examples, SGD control lines 306, and/or SGS control lines 320 may span memory sub-blocks in an orthogonal direction or other non-parallel directions relative to memory access lines 304. SGD and SGS control lines 306, 320 may, for instance, be substantially parallel to one or more signal lines.

Because each SGS control line 320 may be associated with a respective plurality of memory sub-blocks 302, SGS select transistors connected to an active SGS control line 320 may be enabled while SGS select transistors connected to an inactive SGS control line 320 may be disabled. In some examples, any ratio of SGD control lines 306 to SGS control lines 320 and/or any ratio of memory access lines 304 to SGS control lines 320 may be achieved. By way of example, the memory block 300 may include 32 memory sub-blocks 302, and each SGS control line 320 may be connected to the SGS select transistors of strings for 4 memory sub-blocks 302 of the memory block 300. Accordingly, a 4:1 ratio of SGD control lines 306 to SGS control lines 320 and a 1:8 ratio of memory access lines 304 to SGS control lines 320 may be achieved. In other examples, each SGS control line 320 may be connected to the SGS select transistors of strings for 2, 8, 16, 32, 64, or any other number of memory sub-blocks 302. It will be appreciated that in some examples, each SGS control line 320 may be connected to the SGS select transistors of strings for a same number of memory sub-blocks 302, and that in other examples, SGS control lines 320 may be connected to the SGS select transistors of strings for differing numbers of memory sub-blocks 302. A first SGS control line 320, for instance, may be connected to the SGS select transistors of strings for 8 memory sub-blocks and a second SGS control line 320 may be connected to the SGS select transistors of strings for 16 memory sub-blocks 320.

Figure 4:
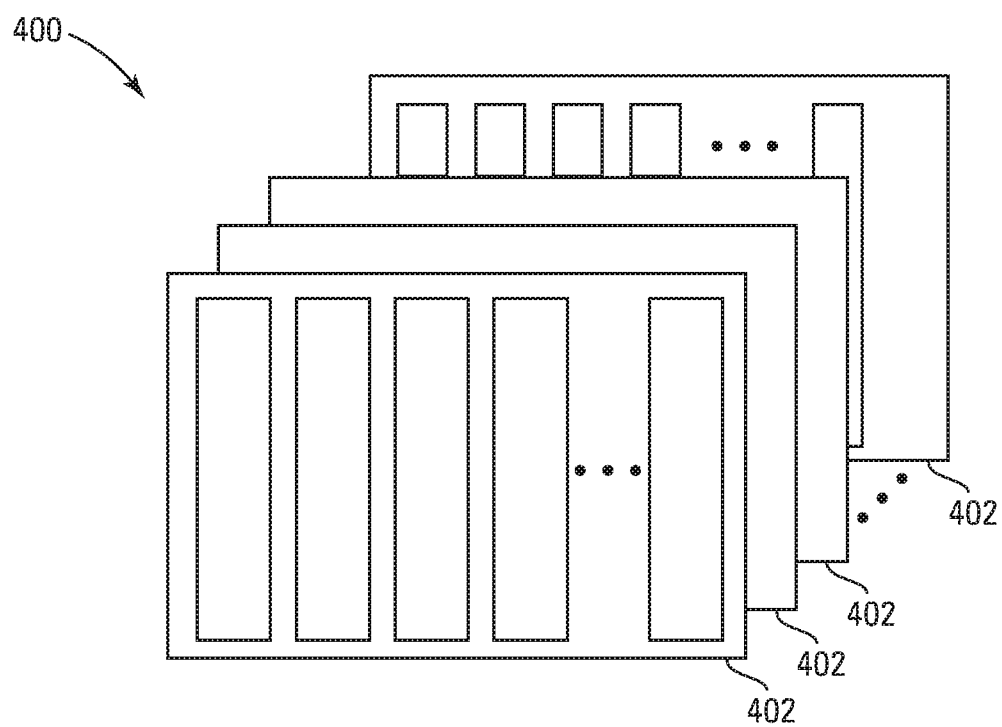
FIG. 4 is a block diagram of a three-dimensional memory array according to an embodiment.

In some examples, the memory block 300 may be implemented in a three-dimensional arrangement. FIG. 4 is a block diagram of a three-dimensional memory array 400 according to an embodiment. The three-dimensional memory array 400 may include any number of memory blocks 402, one or more of which may be implemented using the memory block 300 of FIG. 3. By way of example, the three-dimensional memory array 400 may include 32 memory blocks 402, or may include 64 memory blocks 402. In some examples, memory cells of each memory block 402 may be accessed concurrently, simultaneously, and/or in an otherwise overlapping manner such that data may be read from, programmed to, and/or erased from multiple memory blocks 402 in accordance with one or more memory operations. As used herein, a first act and a second act occur concurrently when the first act occurs simultaneously with the second act for at least a portion of a duration of the second act. In other examples, the memory blocks 402 may be configured to share one or more components, such as signal lines and/or control lines.

Referring again to FIG. 3, generally, memory operations (e.g., read operations, program operations, erase operations) may be performed on one or more selected memory sub-blocks 302 while all other memory sub-blocks 302 may be unselected. Performing a memory operation on one or more selected memory sub-blocks 302 may include selectively enabling SGD select transistors, SGS select transistors, and/or memory cells. Description of memory operations is made herein with respect to individual memory sub-blocks 302. It will be appreciated, however, that in some examples, one or more described operations may be applied concurrently to any number of memory sub-blocks 302. Moreover, reference is made herein to selectively enabling SGD and SGS select transistors to perform memory operations. As described, SGD and SGS select transistors may be enabled by providing control signals on SGD control lines 306 or SGS control lines 320, respectively, and control signals provided in this manner may be provided by the control unit 350.

Various embodiments described herein are directed to breaking a memory block 300 into a plurality of "memory subsets" (sometimes referred to hereinafter as "memory segments" or "partial memory blocks") thereof. In some embodiments, the memory segments are referred to as SGS memory segments, and each SGS memory segment includes, for example, four memory sub-blocks 302 that share a common SGS control line 320. In FIG. 3, two SGS memory segments 330(1) and 330(2) (collectively referred to as SGS memory segments 330) are shown. Each memory segment 330 of the memory block 300 may be selected (e.g., controlled) independently from other memory segments 330 to concurrently perform a memory operation on the cells corresponding to the selected memory segment 330 while refraining from performing the memory operation on the cells corresponding to non-selected memory segments 330.

In various embodiments, each individual memory segment of the memory segments 330 of the (selected) memory block 300 may be independently selected from other memory segments, for example, by applying different control signals (e.g., voltages) to corresponding portions of the memory segments. For example, in various embodiments, for an erase operation, the memory segment 330(1) may be selected, and the memory operation (e.g., the erase operation) may be performed only on the cells of the strings corresponding to the selected memory segment 330(1) while refraining from performing the memory operation on the cells corresponding to the other memory segments.

An erase verify operation may be performed to determine if memory cells have been properly erased. If the verify discovers that a memory cell has not been properly erased, the erase voltage Verase may be increased by a certain step voltage (e.g., 0.5V), and the erase operation may be repeated.

The erase operation in some NAND devices may rely on a leakage current generated by the select transistors (e.g., SGS, SGD), located on both ends of each string, to sustain a high voltage in the cell channel, while the memory access lines (e.g., word lines 304) are biased at a low voltage, such as a ground potential (e.g., 0V). Specifically, the leakage current may be a gate-induced drain leakage (GIDL), generated when the SGS control line 320 for a selected memory segment 330 is biased negatively with respect to the source potential SRC (e.g., −5V) and the SGD control line 302 is biased negatively with respect to the signal line VBL (e.g., −5V). For example, the source SRC and the signal line VBL may both be biased at an erase voltage Verase (e.g., about 20V), and the SGS control line 320 and the SGD control line 306 for a selected memory segment 330 may both be biased at an erase voltage of Verase-5V. In a memory block 300, the erase operation can be practically inhibited for non-selected memory segments 330(2) by reducing this leakage current through a decreased gate bias offset (e.g., biased to 0 offset or to a small (e.g., less than 1V) offset, δ, depending on the erase efficiency versus offset). For example, with the source SRC and the signal line VBL both biased at the erase voltage Verase, the SGS control line 320 and the SGD control line 306 may both be biased at an erase inhibit voltage of Verase-δ for memory segments 330 that are to be inhibited. In such a configuration, the large erase potential may not be sustained in the string channels, and the erase is inhibited with only marginal Vt shifts. In various embodiments, all SGD control lines 306 of a given SGS memory segment 330 may be driven together.

In a block erase method, all memory sub-blocks 302 may be erased together in a memory block 300 as soon as one memory sub-block 302 is failing verify, regardless of the number of memory sub-blocks 302 actually failing erase verify. In other words, the erase exit method is based on the first memory sub-block 302 to fail in a memory block 300. This situation potentially creates an overstress on other memory sub-blocks 302 of the considered memory block 300. As an alternative to this method, a complementary erase per memory sub-block 302 may be performed. In such a method, all memory sub-blocks 302 may be verified, and then a complementary pulse may be selectively applied to failing memory sub-blocks 302 and not to passing memory sub-blocks. This method may involve biasing the SGD control lines 306 differently than the SGS control lines 320, and generating GIDL on the bit line side only, which may not be suitable for some NAND devices. It may be more suitable for some NAND devices to generate GIDL from both ends, such as with the method described above. In an erase per SGS memory segment method according to various embodiments, GIDL may be generated from both ends, but only on one (active) SGS memory segment 330 at a time.

Various embodiments disclosed herein are directed to an erase verify method per SGS memory segment 330 in which erase verify and complementary erase pulses may be limited to SGS memory segments 330 instead of a full memory block 300. The segmented erase verify method may exit at the first memory sub-block 302 failing verify in a given SGS memory segment 330. The number of memory sub-blocks 302 overstressed may be limited to one SGS memory segment 330 as compared to a full memory block 300 in the block erase method.

In some embodiments, the method may involve switching from a block erase mode to a segment erase mode when a set of predetermined criteria is satisfied, such as one or more of the following: (1) When a given number of memory sub-blocks has already passed verify, e.g., about 90% (or 7/8 SGS memory segments passing); (2) when the erase voltage Verase or the number of erase loops is approaching a given limit; or (3) after a certain number of P/E cycles on a given memory block.

In some embodiments, the method may involve testing all memory sub-blocks in the block erase mode, and switching from the block erase mode to a segment erase mode as soon as 1 memory sub-block out of 32 is failing; and then switching back to the block erase mode when all memory sub-blocks are marked for erase in the segment erase mode. In another embodiment, the method may involve switching from the block erase mode to the segment erase mode when a certain erase voltage Verase is reached (for reliability), which may limit the extra erase verify time that can occur in the segment erase mode. Multiple memory segments may be erased together at a time.

Figure 5:
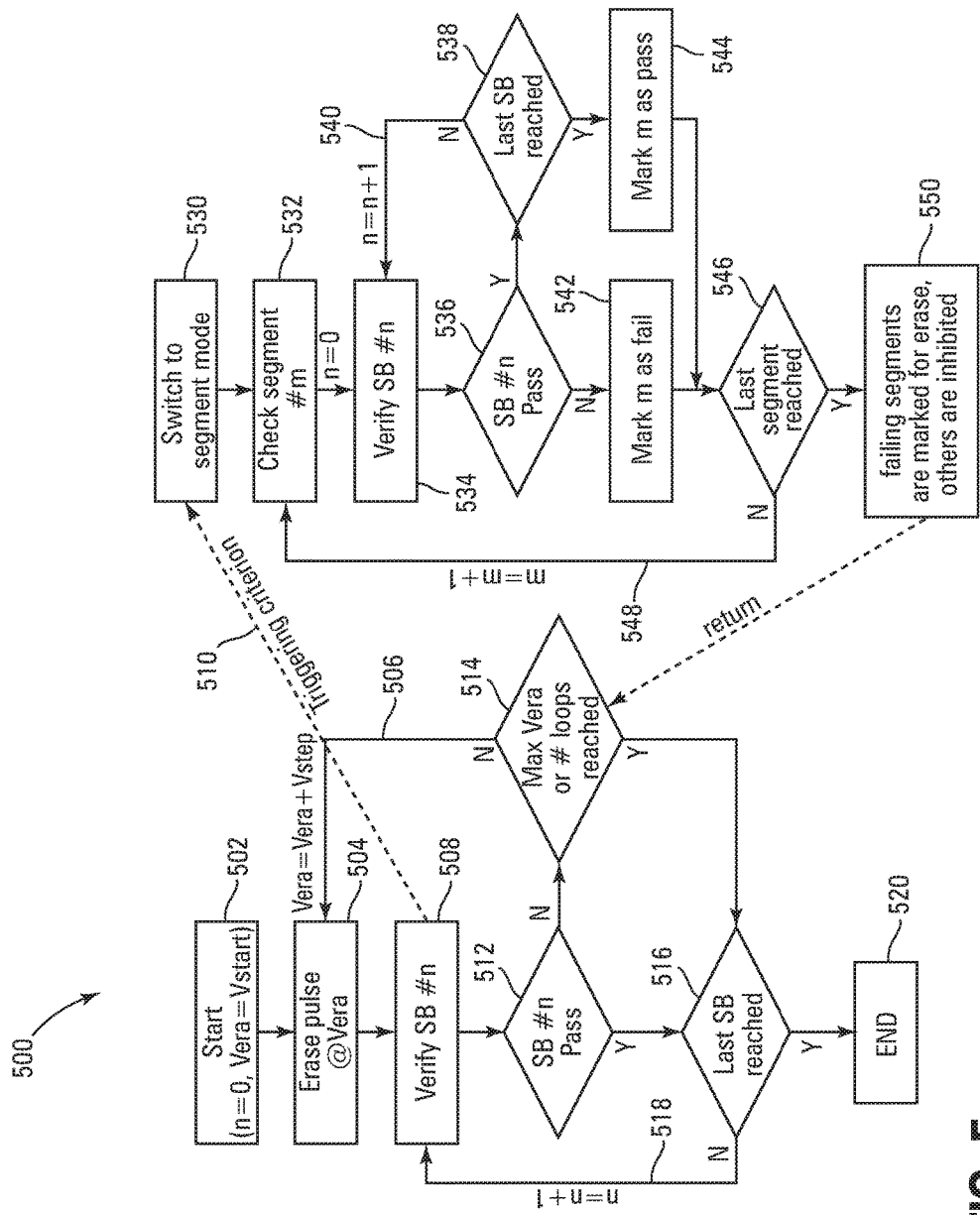
FIG. 5 is a flowchart of a method for erasing a non-volatile memory device according to an embodiment.

FIG. 5 is a flowchart of a method 500 for performing erase operations in a non-volatile memory device according to an embodiment. The method 500 begins at 502 in a block erase mode, where the memory sub-block identifier variable, n, begins with a starting value of 0, and the erase voltage Verase (also referred to as Vera) begins with a starting voltage of Vstart. At 504, an erase pulse at a voltage of Vera is applied to a memory block in the non-volatile memory device. At 508, an erase verify operation is performed on memory sub-block (SB) number n (e.g., memory sub-block 0 for the first iteration). Also at 508, if the triggering criterion for switching from the block erase mode to a segment erase mode is satisfied, the method 500 moves to 530 and switches to the segment erase mode, which will be described in further detail below.

Assuming that the triggering criterion for switching to the segment erase mode has not been satisfied, the method 500 moves to 512 to determine whether memory sub-block number n has passed the erase verify performed at 508. Passing erase verify according to an embodiment means that the number of errors is less than or equal to cfbyte, where cfbyte represents an allowed number of errors. If it is determined at 512 that the memory sub-block number n has not passed erase verify, the method 500 moves to 514 to determine whether a maximum allowed voltage of Vera has been reached or whether a maximum allowed number of loops has been reached. If it is determined at 514 that the maximum allowed voltage of Vera has not been reached and the maximum allowed number of loops has also not been reached, the method 500 increments the erase voltage Vera by a step voltage Vstep as indicated at 506, and the method 500 returns to 504 to apply an erase pulse at the stepped-up value of Vera. If it is determined at 514 that either the maximum allowed voltage of Vera has been reached or the maximum allowed number of loops has been reached, the method 500 moves to 516. If it is determined at 512 that the memory sub-block number n has passed erase verify, the method 500 moves to 516.

At 516, the method 500 determines whether the last memory sub-block has been reached. If it is determined at 516 that the last memory sub-block has not been reached, the method 500 increments the memory sub-block identifier variable n by a value of 1 as indicated at 518, and the method 500 returns to 508 to verify the next memory sub-block. If it is determined at 516 that the last memory sub-block has been reached, the method 500 moves to 520, which indicates the end of the method 500.

As mentioned above, if the triggering criterion for switching from the block erase mode to a segment erase mode is satisfied, the method 500 moves from 508 to 530 and switches to the segment erase mode. At 532, the method 500 begins checking memory segment number m, where m is a memory segment identification variable. At 534, an erase verify operation is performed on memory sub-block number n (e.g., memory sub-block 0 for the first iteration), and the method 500 moves to 536 to determine whether memory sub-block number n has passed the erase verify performed at 534. Passing erase verify according to an embodiment means that the number of errors is less than or equal to cfbyte. If it is determined at 536 that the memory sub-block number n has passed erase verify, the method 500 moves to 538 to determine whether the last memory sub-block has been reached. If it is determined at 538 that the last memory sub-block has not been reached, the method 500 increments the memory sub-block identifier variable n by a value of 1 as indicated at 540, and the method 500 returns to 534 to verify the next memory sub-block. If it is determined at 538 that the last memory sub-block has been reached, the method 500 moves to 544 to mark the memory segment number m as passing, and the method 500 moves to 546, which will be described below.

If it is determined at 536 that the memory sub-block number n has not passed erase verify, the method 500 moves to 542 to mark the memory segment number m as failed, and the method 500 moves to 546. At 546, the method 500 determines whether the last memory segment has been reached. If it is determined at 546 that the last memory segment has not been reached, the memory segment identification variable m is incremented by a value of 1 as indicated at 548, and the method 500 returns to 532 to check the next memory segment. If it is determined at 546 that the last memory segment has been reached, the method 500 moves to 550, where failing memory segments are marked for an additional erase operation while passing memory segments are inhibited from the additional erase operation. The method 500 then moves to 514, which was described above.

Figure 6:
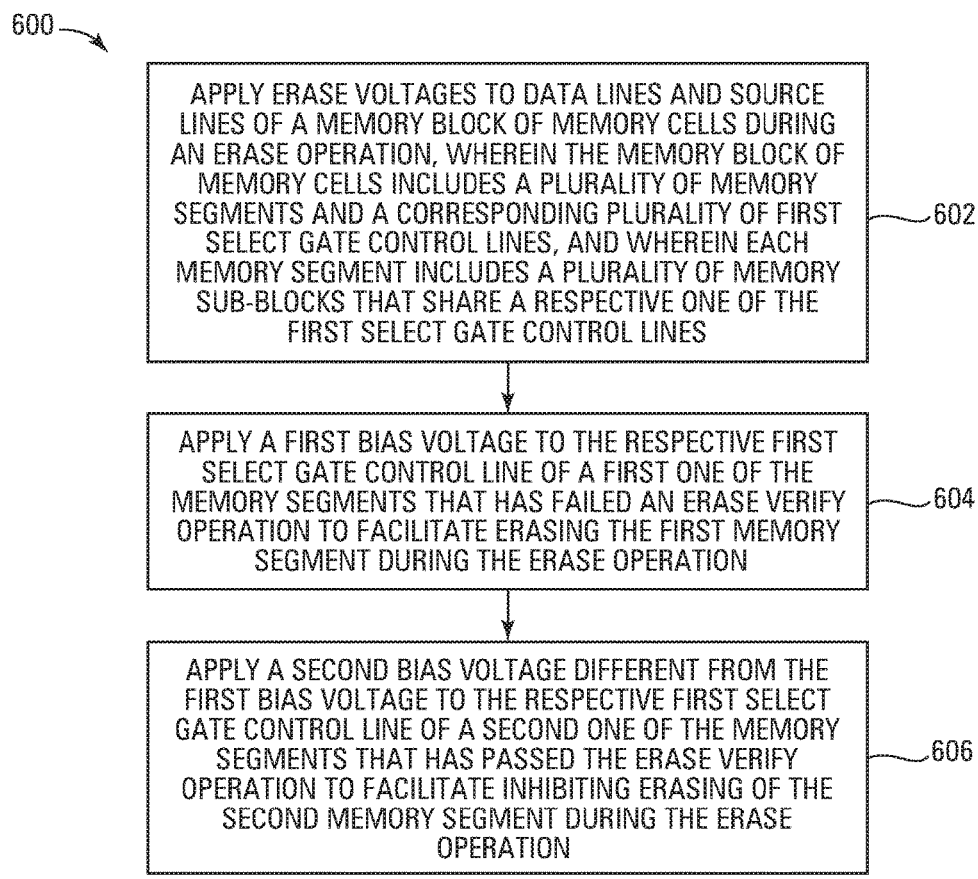
FIG. 6 is a flow diagram illustrating a method of performing an erase operation according to an embodiment.

FIG. 6 is a flow diagram illustrating a method 600 of performing erase operations, such as in a non-volatile NAND architecture memory device, according to an embodiment. An 602 in method 600, erase voltages are applied to data lines and source lines of a memory block of memory cells during an erase operation, wherein the memory block of memory cells includes a plurality of memory segments and a corresponding plurality of first select gate control lines, and wherein each memory segment includes a plurality of memory sub-blocks that share a respective one of the first select gate control lines. At 604, a first bias voltage is applied to the respective first select gate control line of a first one of the memory segments that has failed an erase verify operation to facilitate erasing the first memory segment during the erase operation. At 606, a second bias voltage different from the first bias voltage is applied to the respective first select gate control line of a second one of the memory segments that has passed the erase verify operation to facilitate inhibiting erasing of the second memory segment during the erase operation.

In an embodiment of method 600, each memory sub-block in each of the memory segments is connected to a second select gate control line that is not shared with other memory sub-blocks, and the method further includes: applying the first bias voltage to the second select gate control line of each of the memory sub-blocks of the first memory segment to facilitate erasing the first memory segment during the erase operation; and applying the second bias voltage to the second select gate control line of each of the memory sub-blocks of the second memory segment to facilitate inhibiting erasing of the second memory segment during the erase operation. In an embodiment, the first select gate control lines are select gate source (SGS) control lines, and the second select gate control lines are select gate drain (SGD) control lines. In another embodiment, the first select gate control lines are select gate drain (SGD) control lines, and the second select gate control lines are select gate source (SGS) control lines. SGD bias may be different from SGS bias when erasing or inhibiting a memory segment.

In an embodiment, the method 600 further includes applying a ground voltage to memory access lines of the memory cells in the memory block during the erase operation. In an embodiment, the memory block of memory cells in method 600 is implemented in a non-volatile NAND architecture memory device. Each memory sub-block in method 600 according to an embodiment includes at least one NAND memory string. The method 600 according to an embodiment further includes: performing a second erase verify operation to identify a set of failing memory segments in the plurality of memory segments that failed to be properly erased by the erase operation and a set of passing memory segments in the plurality of memory segments that were properly erased by the erase operation; and performing a second erase operation on the set of failing memory segments while inhibiting the set passing memory segments from the second erase operation.

Another embodiment is directed to a method that includes biasing data lines and source lines of a memory block of memory cells in a memory device at an erase voltage during an erase operation, wherein the memory block of memory cells includes a plurality of memory segments connected to a corresponding plurality of first select gate control lines, and wherein each memory segment includes a plurality of memory sub-blocks that share a respective one of the first select gate control lines. The method further includes biasing the first select gate control line of a first set of the memory segments that have failed an erase verify operation at a first bias voltage to facilitate erasing the first set of memory segments during the erase operation, and biasing the first select gate control line of a second set of the memory segments that have passed the erase verify operation at a second bias voltage to facilitate inhibiting erasing of the second set of memory segment during the erase operation. In an embodiment, the first bias voltage is offset from the erase voltage by about 4-6V, and the second bias voltage is offset from the erase voltage by less than about 1V. The second bias voltage according to an embodiment is substantially equal to the erase voltage.

Another embodiment is directed to a method of operating a non-volatile memory device including a memory block having a plurality of memory sub-blocks organized into a plurality of memory segments, a plurality of select gate source (SGS) control lines respectively associated with the first plurality of memory segments, and a plurality of select gate drain (SGD) control lines respectively associated with the plurality of memory sub-blocks. The method includes applying at least one erase voltage to data lines and source lines of the non-volatile memory device during an erase operation, and selectively biasing the SGS control lines and the SGD control lines during the erase operation to enable erasing of at least one of the memory segments that has failed an erase verify operation and inhibit erasing of at least one of the memory segments that has passed the erase verify operation.

In an embodiment, the method further includes switching between a block erase mode and a segment erase mode based on a set of predetermined criteria, wherein erase operations are performed on all memory sub-blocks in the memory block in the block erase mode, and wherein erase operations are performed only on selected memory segments in the memory block in the segment erase mode. The set of predetermined criteria may include: a number of memory sub-blocks that have passed or failed the erase verify operation; an erase voltage in the at least one erase voltage being increased to a threshold value; or a number of erase loops that have been performed on the memory block.

Another embodiment is directed to an apparatus that includes a memory array having a plurality of memory blocks, wherein each memory block includes a plurality of memory segments, wherein each memory segment includes a plurality of memory sub-blocks, wherein each memory block includes a plurality of select gate source (SGS) control lines respectively associated with the plurality of memory segments of the memory block, and wherein each memory block includes a plurality of select gate drain (SGD) control lines respectively associated with the plurality of memory sub-blocks of the memory block. The apparatus includes a controller, wherein the controller is adapted to erase memory cells in a selected memory block of the memory array during an erase operation by: biasing data lines and source lines of the selected memory block at an erase voltage; and selectively biasing the SGS control lines and the SGD control lines of the selected memory block to enable erasing of a first one of the memory segments of the selected memory block that has failed an erase verify operation and inhibit erasing of a second one of the memory segments of the selected memory block that has passed the erase verify operation.

In an embodiment of the apparatus, the memory array is a NAND architecture memory array. In an embodiment, the memory array is a three-dimensional (3D) NAND architecture memory array.

Another embodiment is directed to an apparatus that includes a first plurality of memory sub-blocks of a memory block and a second plurality of memory sub-blocks of the memory block. The apparatus includes a first select gate control line associated with the first plurality of memory sub-blocks, the first select gate control line connected to a first plurality of select gate transistors of the first plurality of memory sub-blocks, the first plurality of select gate transistors connected to a source. The apparatus includes a second select gate control line associated with the second plurality of memory sub-blocks, the second select gate control line connected to a second plurality of select gate transistors of the second plurality of memory sub-blocks, the second plurality of select gate transistors connected to the source. The apparatus includes a control unit configured to perform an erase verify operation, and configured to apply a first bias voltage to the first select gate control line in response to the erase verify operation to facilitate erasing the first plurality of memory sub-blocks during an erase operation in which the source is biased at an erase voltage, and apply a second bias voltage different from the first bias voltage to the second select gate control line in response to the erase verify operation to facilitate inhibiting erasing of the second plurality of memory sub-blocks during the erase operation.

In an embodiment, the apparatus includes a plurality of memory access lines, each memory access line of the plurality of memory access lines associated with each memory sub-block of the first plurality of memory sub-blocks and each memory sub-block of the second plurality of memory sub-blocks. In an embodiment, the control unit is configured to bias the plurality of memory access lines at or near a ground voltage during the erase operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:
applying erase voltages to data lines and source lines of a memory block of memory cells during an erase operation, wherein the memory block of memory cells includes a plurality of memory segments and a corresponding plurality of first select gate control lines, and wherein each memory segment includes a plurality of memory sub-blocks that share a respective one of the first select gate control lines;
applying a first bias voltage to the respective first select gate control line of a first one of the memory segments to facilitate erasing the first memory segment during the erase operation; and
applying a second bias voltage different from the first bias voltage to the respective first select gate control line of a second one of the memory segments to facilitate inhibiting erasing of the second memory segment during the erase operation.

2. The method of claim 1, wherein each memory sub-block in each of the memory segments is connected to a second select gate control line that is not shared with other memory sub-blocks.

3. The method of claim 2, and further comprising:
applying the first bias voltage to the second select gate control line of each of the memory sub-blocks of the first memory segment to facilitate erasing the first memory segment during the erase operation.

4. The method of claim 3, and further comprising:
applying the second bias voltage to the second select gate control line of each of the memory sub-blocks of the second memory segment to facilitate inhibiting erasing of the second memory segment during the erase operation.

5. The method of claim 4, wherein the first select gate control lines are select gate source (SGS) control lines, and the second select gate control lines are select gate drain (SGD) control lines.

6. The method of claim 4, wherein the first select gate control lines are select gate drain (SGD) control lines, and the second select gate control lines are select gate source (SGS) control lines.

7. The method of claim 1, and further comprising:
applying a ground voltage to memory access lines of the memory cells in the memory block during the erase operation.

8. The method of claim 1, wherein the memory block of memory cells is implemented in a non-volatile NAND architecture memory device.

9. The method of claim 1, wherein the first bias voltage is applied to the respective first select gate control line of the first memory segment in response to the first memory segment failing an erase verify operation, and wherein the second bias voltage is applied to the respective first select gate control line of the second memory segment in response to the second memory segment passing the erase verify operation.

10. The method of claim 9, and further comprising:
performing a second erase verify operation to identify a set of failing memory segments in the plurality of memory segments that failed to be properly erased by the erase operation and a set of passing memory segments in the plurality of memory segments that were properly erased by the erase operation; and
performing a second erase operation on the set of failing memory segments while inhibiting the set of passing memory segments from the second erase operation.

11. A method, comprising:
biasing data lines and source lines of a memory block of memory cells in a memory device at an erase voltage during an erase operation, wherein the memory block of memory cells includes a plurality of memory segments connected to a corresponding plurality of first select gate control lines, and wherein each memory segment includes a plurality of memory sub-blocks that share a respective one of the first select gate control lines;
biasing the first select gate control line of a first set of the memory segments at a first bias voltage to facilitate erasing the first set of memory segments during the erase operation, wherein the first bias voltage is offset from the erase voltage by 4-6V; and
biasing the first select gate control line of a second set of the memory segments at a second bias voltage to facilitate inhibiting erasing of the second set of memory segments during the erase operation.

12. The method of claim 11, wherein the second bias voltage is offset from the erase voltage by less than 1V.

13. The method of claim 11, wherein the first select gate control line of the first set of the memory segments is biased at the first bias voltage in response to the first set of the memory segments failing an erase verify operation, and wherein the first select gate control line of the second set of the memory segments is biased at the second bias voltage in response to the second set of the memory segments passing the erase verify operation.

14. A method of operating a non-volatile memory device including a memory block having a plurality of memory sub-blocks organized into a plurality of memory segments, a plurality of select gate source (SGS) control lines respectively associated with the plurality of memory segments, and a plurality of select gate drain (SGD) control lines respectively associated with the plurality of memory sub-blocks, the method comprising:
applying at least one erase voltage to data lines and source lines of the non-volatile memory device during an erase operation; and
selectively biasing the SGS control lines and the SGD control lines during the erase operation to provide a first bias voltage to enable erasing of at least one of the memory segments and provide a second bias voltage different than the first bias voltage to inhibit erasing of at least one of the memory segments.

15. The method of claim 14, and further comprising:
switching between a block erase mode and a segment erase mode based on a set of predetermined criteria, wherein erase operations are performed on all memory sub-blocks in the memory block in the block erase mode, and wherein erase operations are performed only on selected memory segments in the memory block in the segment erase mode.

16. The method of claim 15, wherein the set of predetermined criteria includes at least one of: a number of memory sub-blocks that have passed or failed the erase verify operation; an erase voltage in the at least one erase voltage being increased to a threshold value; and a number of erase loops that have been performed on the memory block.

17. The method of claim 14, wherein the SGS control lines and the SGD control lines are selectively biased to provide the first bias voltage to enable erasing of the at least one of the memory segments in response to the at least one of the memory segments failing an erase verify operation.

18. The method of claim 14, wherein the SGS control lines and the SGD control lines are selectively biased to provide the second bias voltage to inhibit erasing of the at least one of the memory segments in response to the at least one of the memory segments passing an erase verify operation.

19. An apparatus, comprising:
a memory array having a plurality of memory blocks, wherein each memory block includes a plurality of memory segments, wherein each memory segment includes a plurality of memory sub-blocks, wherein each memory block includes a plurality of select gate source (SGS) control lines respectively associated with the plurality of memory segments of the memory block, and wherein each memory block includes a plurality of select gate drain (SGD) control lines respectively associated with the plurality of memory sub-blocks of the memory block; and
a controller, wherein the controller is adapted to erase memory cells in a selected memory block of the memory array during an erase operation by:
biasing data lines and source lines of the selected memory block at an erase voltage; and
selectively biasing the SGS control lines and the SGD control lines of the selected memory block differently for different ones of the memory segments to enable erasing of a first one of the memory segments of the selected memory block and inhibit erasing of a second one of the memory segments of the selected memory block.

20. The apparatus of claim 19, wherein the memory array is a NAND architecture memory array.

21. The apparatus of claim 19, wherein the SGS control lines and the SGD control lines are selectively biased to enable erasing of the first one of the memory segments in response to the first one of the memory segments failing an erase verify operation, and wherein the SGS control lines and the SGD control lines are selectively biased to inhibit erasing of the second one of the memory segments in response to the second one of the memory segments passing the erase verify operation.

22. An apparatus, comprising:
a first plurality of memory sub-blocks of a memory block;
a second plurality of memory sub-blocks of the memory block;
a first select gate control line associated with the first plurality of memory sub-blocks, the first select gate control line connected to a first plurality of select gate transistors of the first plurality of memory sub-blocks, the first plurality of select gate transistors connected to a source;

a second select gate control line associated with the second plurality of memory sub-blocks, the second select gate control line connected to a second plurality of select gate transistors of the second plurality of memory sub-blocks, the second plurality of select gate transistors connected to the source; and a control unit configured to apply a first bias voltage to the first select gate control line to facilitate erasing the first plurality of memory sub-blocks during an erase operation, and apply a second bias voltage different from the first bias voltage to the second select gate control line to facilitate inhibiting erasing of the second plurality of memory sub-blocks during the erase operation.

23. The apparatus of claim 22, and further comprising:

a plurality of memory access lines, each memory access line of the plurality of memory access lines associated with each memory sub-block of the first plurality of memory sub-blocks and each memory sub-block of the second plurality of memory sub-blocks, and wherein the control unit is configured to bias the plurality of memory access lines at or near a ground voltage during the erase operation.

24. The apparatus of claim 22, wherein the control unit is configured to apply the first bias voltage and the second bias voltage in response to an erase verify operation.

* * * * *